(12) United States Patent
Chang

(10) Patent No.: US 11,074,857 B2
(45) Date of Patent: Jul. 27, 2021

(54) DC BOOST CIRCUIT AND METHOD

(71) Applicant: Shenzhen China Star Optoelectronics Semiconductor Display Technology Co., Ltd., Shenzhen (CN)

(72) Inventor: Bobiao Chang, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 422 days.

(21) Appl. No.: 16/096,694

(22) PCT Filed: Sep. 18, 2018

(86) PCT No.: PCT/CN2018/106338
§ 371 (c)(1),
(2) Date: Oct. 25, 2018

(87) PCT Pub. No.: WO2019/232976
PCT Pub. Date: Dec. 12, 2019

(65) Prior Publication Data
US 2021/0110768 A1    Apr. 15, 2021

(30) Foreign Application Priority Data

Jun. 6, 2018 (CN) .......................... 201810575298.7

(51) Int. Cl.
*H02M 3/156* (2006.01)
*G09G 3/3233* (2016.01)
(Continued)

(52) U.S. Cl.
CPC .......... *G09G 3/3233* (2013.01); *H02M 3/155* (2013.01); *H03F 3/45475* (2013.01); *G09G 2320/0204* (2013.01); *G09G 2330/02* (2013.01)

(58) Field of Classification Search
CPC .... H02M 3/156; H02M 3/155; H02M 3/1582; G09G 3/3233; G05F 1/00
See application file for complete search history.

(56) References Cited

U.S. PATENT DOCUMENTS 4,823,070 A * 4/1989 Nelson .............. H02M 3/33523
                                                    323/285
7,268,526 B1 * 9/2007 Smith ................... H02M 3/156
                                                    323/284
(Continued)

FOREIGN PATENT DOCUMENTS

| CN | 101064470 A | 10/2007 |
| CN | 107508461 A | 12/2017 |
| CN | 107735933 A | 2/2018 |

*Primary Examiner* — Yuzhen Shen
(74) *Attorney, Agent, or Firm* — Leong C. Lei

(57) ABSTRACT

The present invention teaches a DC boost circuit and method. The circuit includes an inductor, a diode, a first capacitor, a first FET, a first voltage conversion unit, a voltage drop detection module, a reference voltage adjustment module, and a control module. After a load is connected, the voltage drop detection module obtains a current flowing through the diode and outputs a corresponding second voltage to the reference voltage adjustment module, causing an output voltage from the reference voltage adjustment module greater than an original reference voltage. The control module controls the first FET to increase a ratio of its conduction interval to its cutoff interval in a cycle of conduction and cutoff, thereby increasing the output voltage to compensate the voltage drop resulted from the impedance (Continued)

between the DC boost circuit and the load. The output voltage is therefore ensured to have a stable level.

6 Claims, 3 Drawing Sheets

(51) Int. Cl.
*H02M 3/155* (2006.01)
*H03F 3/45* (2006.01)

(56) References Cited

U.S. PATENT DOCUMENTS

| | | | |
|---|---|---|---|
| 8,581,567 B2 * | 11/2013 | Shimizu | H02M 3/156 323/285 |
| 9,392,653 B2 * | 7/2016 | Lee | H05B 45/37 |
| 2012/0286752 A1 * | 11/2012 | Tsukiji | H04N 5/63 323/282 |
| 2013/0162226 A1 | 6/2013 | Su et al. | |
| 2014/0269799 A1 * | 9/2014 | Ortiz | H01S 5/0428 372/38.02 |
| 2015/0381037 A1 * | 12/2015 | Romeo | H02M 3/156 323/282 |

* cited by examiner

DC BOOST CIRCUIT AND METHOD

FIELD OF THE INVENTION

The present invention is generally related to the field of display technology and more particularly to a direct current (DC) boost circuit and a DC boost method.

BACKGROUND OF THE INVENTION

Organic light emitting diode (OLED) display device is deemed as the most promising display device by the industry due to its self-illumination, low driving voltage, high lighting efficiency, short response time, enhanced clarity and contrast, nearly 180-degree viewing angle, wide operation temperature range, and the capability to fulfill flexible, large-dimension, full-color display.

According to its driver mechanism, an OLED display device may be categorized as a passive matrix OLED (PMOLED) display device using direct addressing or an active matrix OLED (AMOLED) display device using thin film transistor (TFT) addressing. AMOLED involves pixels in an array, and is an active type of display device. AMOLED display device has high lighting efficiency, and is usually employed in a high-resolution, large-dimension display device.

AMOLED is a current driven device. When current flows through a TFT, the TFT illuminates whose brightness is determined by the current. Most existing integrated circuits (ICs) provide voltage signals. AMOLED pixel driving circuit therefore requires the conversion of voltage signals to current signals. Conventional AMOLED pixel driving circuit usually involves a 2T1C (i.e., two TFTs and one capacitor) structure to convert voltage into current.

In the existing technique, positive power voltage (OVDD) has to be supplied to the AMOLED pixel driving circuit so as to drive the OLEDs of the pixels to illuminate, and the brightness of the OLEDs is related to the magnitude of the positive power voltage. Positive power voltage is usually produced by a DC boost circuit. FIG. 1 is a schematic diagram showing a conventional DC boost circuit. As illustrated, the DC boost circuit includes an inductor L10, a field effect transistor (FET) Q10, a diode D10, and a capacitor C10. The inductor L10 has a first terminal electrically connected to the input voltage Vin, and a second terminal electrically connected to the anode of the diode D10. The cathode of the diode D10 is electrically connected to a load 900 and supplies the positive power voltage OVDD to the load 900. The FET Q10 has its gate receiving a control signal PWM, its source to ground, and its drain electrically connected the second terminal of the inductor L10. The capacitor C10 has a first terminal electrically connected to the cathode of the diode D10, and a second terminal to ground. When the DC boost circuit operates, the FET Q10 is conducted by the control signal PWM and the input voltage Vin charges the inductor L10 and the capacitor C10. When the FET Q10 is cut off by the control signal PWM, the inductor L10 charges the capacitor C10. At this point, the positive power voltage OVDD supplied from the cathode of the diode D10 to the load 900 is greater than the input voltage Vin, thereby achieving voltage boost. However, there is impedance between the DC boost circuit and the load (including the DC boost circuit's own output impedance, and line impedance in the layout of the printed circuit board (PCB)). As more load current is provided, the output positive power voltage would suffer greater voltage drop, and the voltage received by the pixel driving circuit is smaller. When the OLED display panel shows different frames, different load current would be required. Therefore the positive power voltage applying to the pixel driving circuit varies, affecting the current flowing through the pixels' OLEDs and the display quality of the OLED display device.

SUMMARY OF THE INVENTION

An objective of the present invention is to provide a DC boost circuit that compensates the voltage drop in its output voltage and ensures the stability of the output voltage level.

Another objective of the present invention is to provide a DC boost method that compensates the voltage drop in the output voltage of a DC boost circuit and ensures the stability of the output voltage level.

To achieve the objectives, the present invention teaches a DC boost circuit including an inductor, a diode, a first capacitor, a first FET, a first voltage conversion unit, a voltage drop detection module, and a control module.

The inductor has a first terminal electrically connected to an input voltage and a second terminal electrically connected to the anode of the diode; the cathode of the diode is electrically connected and provides an output voltage to a load; the first capacitor has a first terminal electrically connected to the cathode of the diode and a second terminal to ground; the first FET has the drain electrically connected the inductor's second terminal, the gate electrically connected to an output terminal of the control module, and the source electrically connected to an input terminal of the voltage drop detection module; the first voltage conversion unit has an input terminal electrically connected to the cathode of the diode, and an output terminal electrically connected to a first input terminal of the control module; the voltage drop detection module has an output terminal electrically connected to a first input terminal of the reference voltage adjustment module; the reference voltage adjustment module has a second input terminal electrically connected to an original reference voltage, and an output terminal electrically connected to a second input terminal of the control module.

The first voltage conversion unit converts the output voltage to obtain a corresponding first voltage, and supplies the first voltage to the first input terminal of the control module.

The voltage drop detection module obtains and converts a current flowing through the first FET to obtain a corresponding second voltage, and supplies the second voltage to the first input terminal of the reference voltage adjustment module.

The reference voltage adjustment module sums the second voltage and an original reference voltage to obtain an adjusted reference voltage, and supplies the adjusted reference voltage to the second input terminal of the control module.

The control module supplies a first control signal to the first FET to increase a ratio of conduction interval to cutoff interval within a cycle of conduction and cutoff when a voltage difference between the first input terminal and the second input terminal of the control module is greater than a preset standard difference value, so as to increase the output voltage until the voltage difference between the first input terminal and the second input terminal of the control module is equal to the preset standard difference value; and the control module then supplies a second control signal to the first FET to keep the ratio of conduction interval to cutoff interval constant.

The first voltage conversion unit comprises a first resistor and a second resistor; the first resistor has a first terminal electrically connected to the cathode of the diode; a second terminal electrically connected to the first terminal of the second resistor; the second terminal of the second resistor is connected to ground; the first and second terminals of the first resistor are the input and output terminals of the first voltage conversion unit, respectively.

The voltage drop detection module comprises a third resistor, a current operational amplifier, and a second voltage conversion unit; the third resistor has a first terminal electrically connected to the source of the first FET, and a second terminal to ground; the non-inverting input terminal and inverting input terminal of the operational amplifier are electrically connected to the first and second terminals of the third resistor, respectively; the output terminal of the operational amplifier is electrically connected an input terminal of the second voltage conversion unit; an output terminal of the second voltage conversion unit is electrically connected to the first input terminal of the reference voltage adjustment module; the input and output terminals of the voltage drop detection module are the first terminal of the third resistor and the output terminal of the second voltage conversion unit.

The control module comprises an differential amplifier, a pulse width modulation (PWM) controller, and a driving unit; the differential amplifier has the non-inverting input terminal electrically connected to the output terminal of the reference voltage adjustment module, the inverting input terminal electrically connected to the output terminal of the first voltage conversion unit, and an output terminal electrically connected an input terminal of the PWM controller; an output terminal of the PWM controller is electrically connected an input terminal of the driving unit; an output terminal of the driving unit is electrically connected to the gate of the first FET; the first and second input terminals of the control module are respectively the differential amplifier's inverting and non-inverting input terminals; the output terminal of the control module is the output terminal of the driving unit.

The current operational amplifier obtains a voltage difference across the third resistor and outputs the voltage difference to the second voltage conversion unit.

The second voltage conversion unit multiplies the voltage difference across the third resistor by a preset conversion factor to produce a second voltage, and outputs the second voltage to the first input terminal of the reference voltage adjustment module.

The reference voltage adjustment module is a voltage adder.

The differential amplifier produces and output a control voltage to the PWM controller according to a voltage difference between the non-inverting and inverting input terminals of the differential amplifier.

The PWM controller outputs a pulse signal to the driving unit controlled by the control voltage.

The driving unit conducts the first FET when the pulse signal is at a high level and cuts off the first FET when the pulse signal is at a low level.

When the voltage difference between the non-inverting and inverting input terminals of the differential amplifier is greater than the preset standard difference value, the differential amplifier outputs the corresponding control voltage to control the PWM controller to alter the duty ratio of its output pulse signal so that the first FET has a longer conduction interval within a cycle of the of the pulse signal; the output voltage is therefore increased until the voltage difference between the differential amplifier's inverting and non-inverting input terminals equal to the preset standard difference value; and the differential amplifier then outputs the corresponding control voltage to keep the pulse signal of the PWM controller at a fixed duty ratio.

The preset standard difference value is $V_{ref}-(V_o \times R2)/(R1+R2)$; $V_o$ is a preset output voltage standard value; $R1$ is the resistance of the second resistor; $R2$ is the resistance of the second resistor; and $V_{ref}$ is the original reference voltage.

The conversion factor is $(R2 \times R)/((R1+R2) \times R3)$; $R3$ is the resistance of the third resistor; and $R$ is the output impedance of the DC boost circuit plus the line impedance between the DC boost circuit and the load.

The diode is a Schottky diode.

The driving unit comprises a second N-type FET and a third P-type FET; the second N-type FET has the gate electrically connected to the output terminal of the PWM controller, the source electrically connected to a power voltage, and the drain electrically connected to the drain of the third P-type FET; the third P-type FET has the gate electrically connected the output terminal of the PWM controller, the drain electrically connected to the first FET's gate, and the source to ground.

The first FET is an N-type FET.

The DC boost circuit further comprises a second capacitor and a third capacitor, wherein the second capacitor has a first terminal electrically connected to the first terminal of the inductor, and a second terminal to ground; and the third capacitor has a first terminal electrically connected to the cathode of the diode, and a second terminal to the output terminal of the first voltage conversion unit.

The DC boost circuit further comprises a bandgap reference voltage unit electrically connected to the second input terminal of the reference voltage adjustment module, wherein the original reference voltage is provided by the bandgap reference voltage unit.

The output voltage is the positive power voltage to an OLED display device; and the load is the pixel driving circuit of the OLED display device.

The present invention also teaches a DC boost method for the above DC boost circuit. The method includes the following steps:

converting the output voltage of the DC boost circuit to obtain a corresponding first voltage, and supplying the first voltage to the first input terminal of the control module by the first voltage conversion unit;

obtaining and converting a current flowing through the first FET to obtain a corresponding second voltage, and supplying the second voltage to the first input terminal of the reference voltage adjustment module by the voltage drop detection module;

summing the second voltage and an original reference voltage to obtain an adjusted reference voltage, and supplying the adjusted reference voltage to the second input terminal of the control module by the reference voltage adjustment module;

supplying a first control signal to the first FET to increase a ratio of conduction interval to the cutoff interval within a cycle of conduction and cutoff by the control module when a voltage difference between the first input terminal and the second input terminal of the control module is greater than a preset standard difference value, so as to increase the output voltage; and supplying a second control signal to the first FET to maintain a constant ratio of conduction interval to the cutoff interval within a cycle of conduction and cutoff by the control module, when the voltage difference between the second and first input terminals of the control module is equal to the preset standard difference value.

The advantages of the present invention are as follows. The present invention teaches a DC boost circuit including an inductor, a diode, a first capacitor, a first FET, a first voltage conversion unit, a voltage drop detection module, a reference voltage adjustment module, and a control module. After a load is connected, the voltage drop detection module obtains a current flowing through the diode and outputs a corresponding second voltage to the reference voltage adjustment module, causing an output voltage from the reference voltage adjustment module greater than an original reference voltage. The control module controls the first FET to increase a ratio of its conduction interval to its cutoff interval in a cycle of conduction and cutoff, thereby increasing the output voltage to compensate the voltage drop resulted from the impedance between the DC boost circuit and the load. The output voltage is therefore ensured to have a stable level. The present invention also teaches a DC boost method that compensates the output voltage drop due to the impedance between the DC boost circuit and the load, thereby ensuring the output voltage to have a stable level.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
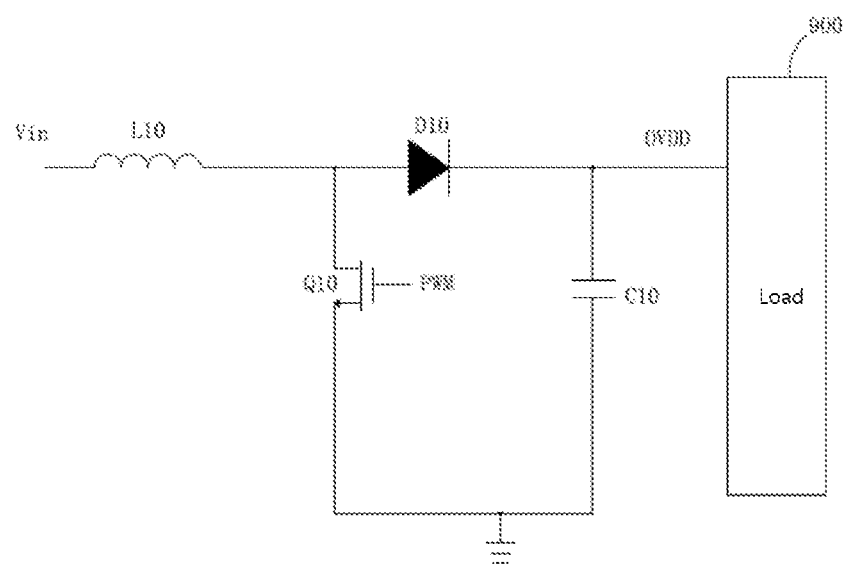
FIG. 1 is a schematic diagram showing a conventional DC boost circuit.
Figure 2:
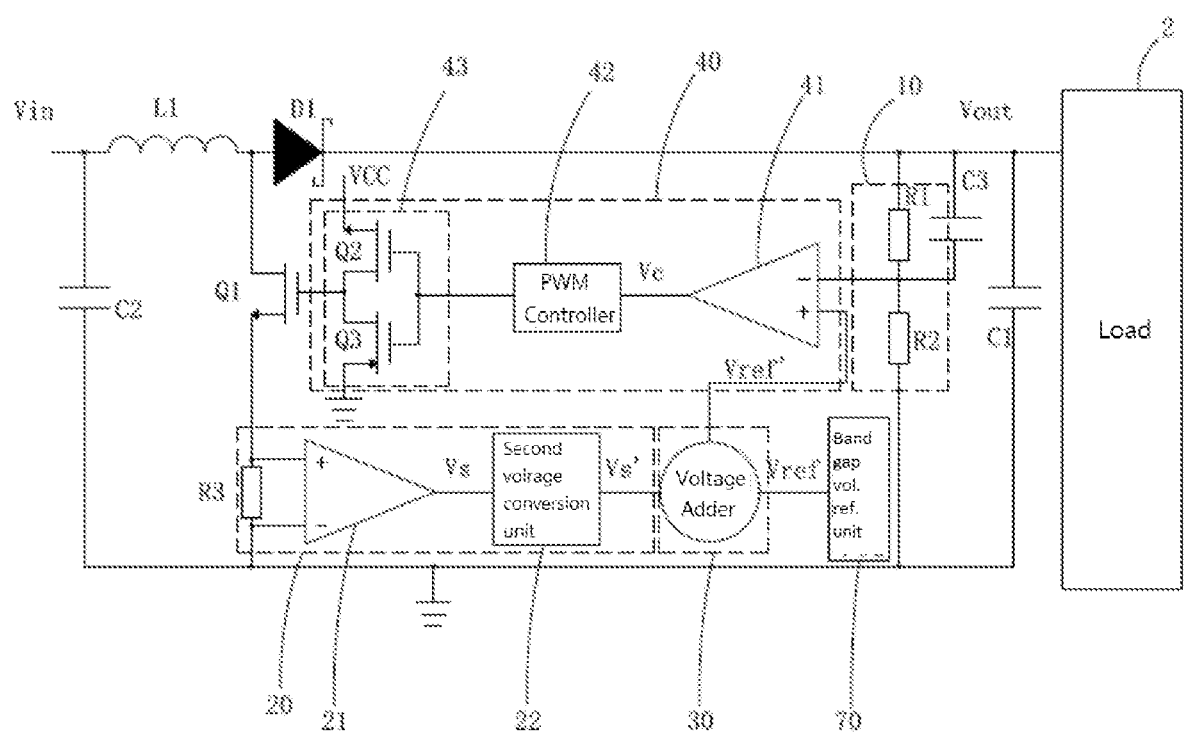
FIG. 2 is a schematic diagram of a DC boost circuit according to an embodiment of the present invention.

As shown in FIG. 2, a DC boost circuit according to an embodiment of the present invention includes an inductor L1, a diode D1, a first capacitor C1, a field effect transistor (FET) Q1, a first voltage conversion unit 10, a voltage drop detection module 20, a reference voltage adjustment module 30, and a control module 40.

The inductor L1 has a first terminal connected to an input voltage Vin and a second terminal electrically connected to the anode of the diode D1. The cathode of the diode D1 is electrically connected and provides an output voltage Vout to a load 2. The first capacitor C1 has a first terminal electrically connected to the cathode of the diode D1 and a second terminal to ground. the first FET Q1 has its drain electrically connected the inductor L is second terminal, its gate electrically connected to an output terminal of the control module 40, and its source electrically connected to the voltage drop detection module 20's input terminal. The first voltage conversion unit 10 has an input terminal electrically connected to the cathode of the diode D1, and an output terminal electrically connected to a first input terminal of the control module 40. The voltage drop detection module 20 has an output terminal electrically connected to a first input terminal of the reference voltage adjustment module 30. The reference voltage adjustment module 30 has a second input terminal electrically connected to an original reference voltage Vref, and an output terminal electrically connected to a second input terminal of the control module 40.

Specifically, the first voltage conversion unit 10 converts the output voltage Vout into a first voltage, and feeds the first voltage to the first input terminal of the control module 40. The voltage drop detection module 20 obtains a current from the first FET Q1, converts the current into a second voltage Vs', and feeds the second voltage Vs' to first input terminal of the reference voltage adjustment module 30. The reference voltage adjustment module 30 obtains an adjusted reference voltage Vref' by summing the original reference voltage Vref and the second voltage Vs' and feeds the adjusted reference voltage Vref' to the second input terminal of the control module 40. The control module 40 outputs a corresponding control signal when a voltage difference between its first and second input terminals is greater than a standard difference value. The control signal controls the first FET Q1 to increate a ratio of conduction interval to cutoff interval during a cycle of conduction and cutoff. The output voltage Vout increases until the voltage difference between the control module 40's first and second input terminals is equal to the preset standard difference value. Then control module 40 then outputs a corresponding control signal to control the first FET Q1 to maintain a constant ratio of conduction interval to cutoff interval during a cycle of conduction and cutoff.

Specifically, as shown in FIG. 2, the first voltage conversion unit 10 of the present embodiment includes a first resistor R1 and a second resistor R2. A first terminal of the first resistor R1 is electrically connected to the cathode of the diode D1. A second terminal of the first resistor R1 is electrically connected to the second resistor R2's first terminal. The second terminal of the second resistor R2 is connected to ground. The first and second terminals of the first resistor R1 are the input and output terminals of the first voltage conversion unit 10.

The voltage drop detection module 20 includes a third resistor R3, a current operational amplifier 21, and a second voltage conversion unit 22. The third resistor R3 has a first terminal electrically connected to the source of the first FET Q1, and a second terminal to ground. The non-inverting input terminal and inverting input terminal of the operational amplifier 21 are electrically connected to the first and second terminals of the third resistor R3, respectively. The second voltage conversion unit 22 is structured as the first voltage conversion unit 10. The output terminal of the operational amplifier 21 is electrically connected an input terminal of the second voltage conversion unit 22. An output terminal of the second voltage conversion unit 22 is electrically connected to the first input terminal of the reference voltage adjustment module 30. The input and output terminals of the voltage drop detection module 20 are the first terminal of the third resistor R3 and the output terminal of the second voltage conversion unit 22.

The control module 40 includes a differential amplifier 41, a pulse width modulation (PWM) controller 42, and a driving unit 43. The differential amplifier 41 has the non-inverting input terminal electrically connected to the output terminal of the reference voltage adjustment module 30, the inverting input terminal electrically connected to the output terminal of the first voltage conversion unit 10, and the output terminal electrically connected an input terminal of the PWM controller 42. An output terminal of the PWM controller 42 is electrically connected an input terminal of the driving unit 43. An output terminal of the driving unit 43 is electrically connected to the gate of the first FET Q1. The first and second input terminals of the control module 40 are respectively the differential amplifier 41's inverting and non-inverting input terminals. The output terminal of the control module 40 is the output terminal of the driving unit 43.

The current operational amplifier 21 obtains the voltage difference Vs across the third resistor R3 and outputs the voltage difference Vs to the second voltage conversion unit 22, which in turn multiplies Vs by a preset conversion factor to produce the second voltage Vs'. The second voltage Vs' is then fed to the first input terminal of the reference voltage adjustment module 30. The reference voltage adjustment module 30 is a voltage adder, and the differential amplifier 41 produces the output voltage Vc corresponding to the voltage difference between its non-inverting and inverting input terminals and outputs the control voltage Vc to the PWM controller 42. The PWM controller 42, controlled by the control voltage Vc, outputs a pulse signal to the driving unit 43. When the pulse signal from the PWM controller 42 is at a high level, the driving unit 43 conducts the first FET Q1. When the pulse signal from the PWM controller 42 is at a low level, the driving unit 43 cuts off the first FET Q1.

Furthermore, when the voltage difference between the non-inverting and inverting input terminals of the differential amplifier 41 is greater than the preset standard difference value, the differential amplifier 41 outputs the corresponding control voltage Vc to control the PWM controller 42 to alter the duty ratio of its output pulse signal so that the first FET Q1 has a longer conduction interval within a cycle of the of the pulse signal. The output voltage Vout is therefore increased until the voltage difference between the differential amplifier 41's inverting and non-inverting input terminals becomes the preset standard difference value. The differential amplifier 41 then outputs the corresponding control voltage Vc to keep the pulse signal of the PWM controller 42 at a fixed duty ratio.

Specifically, as shown in FIG. 2, the preset standard difference value is Vref−(Vo×R2)/(R1+R2), where Vo is a preset output voltage standard value, R1 is the resistance of the second resistor R1, R2 is the resistance of the second resistor R2, Vref is the original reference voltage.

Specifically, as shown in FIG. 2, the diode D1 of the present embodiment is a Schottky diode.

Specifically, as shown in FIG. 2, the present embodiment's driving unit 43 includes a second N-type FET Q2 and a third P-type FET Q3. The second N-type FET Q2 has its gate electrically connected to the output terminal of the PWM controller 42, its source electrically connected to a power voltage VCC, and its drain electrically connected to the drain of the third P-type FET Q3. The third P-type FET Q3 has its gate electrically connected the output terminal of the PWM controller 42, its drain electrically connected to the first FET Q1's gate, and its source to ground. The first FET Q1 is an N-type FET. When the pulse signal of the PWM controller 42 is at a high level, the first FET Q1 is conducted and, when the pulse signal is at a low level, the first FET Q1 is cut off.

Specifically, the output voltage Vout may be used as the positive power voltage to an OLED display device. In other words, the DC boost circuit may function as the DC boost circuit to output positive power voltage. Then, the load 2 is the pixel driving circuit of the OLED display device.

Specifically, the conversion factor is (R2×R)/((R1+R2)×R3), where R3 is the resistance of the third resistor R3, and R is the output impedance of the DC boost circuit plus the line impedance between the DC boost circuit and the load 2.

Specifically, as shown in FIG. 2, the DC boost circuit of the present embodiment further includes a second capacitor C2 and a third capacitor C3. The second capacitor C2 has a first terminal electrically connected to the first terminal of the inductor L1, and a second terminal to ground. The third capacitor C3 has a first terminal electrically connected to the cathode of the diode D1, and a second terminal to the output terminal of the first voltage conversion unit 10, also the second terminal of the first resistor R1.

Specifically, as shown in FIG. 2, the DC boost circuit of the present embodiment further includes a bandgap reference voltage unit 70 electrically connected to the second input terminal of the reference voltage adjustment module 30. The original reference voltage Vref is provided by the bandgap reference voltage unit 70.

The DC boost circuit of the present embodiment operates as follows.

When the DC boost circuit is not connected to any load, the load current is 0 and the output voltage at the cathode of the diode D1 does not have any voltage drop. This no-drop output voltage is said to be the output voltage standard value Vo. The first voltage from the output terminal of the first voltage conversion unit 10, also the voltage at the second terminal of the first resistor R1, is (Vo×R2)/(R1+R2). The first voltage is fed to the control module 40's first input terminal, also the inverting input terminal of the differential amplifier 41. The second input terminal of the control module 40, also the non-inverting input terminal of the differential amplifier 41, has voltage Vref. When the DC boost circuit is connected to a load 2, the connection line would have line impedance, and the DC boost circuit also has output impedance. The output voltage Vout from the cathode of the diode D1 to the load 2 would have voltage drop and the voltage drop would become greater as the load current increases. The output voltage therefore needs compensation. As the current flows through the first FET Q1 is close to the load current, the voltage drop detection module 20 obtains the current flowing through the first FET Q1, or the load current. by capturing the voltage difference Vs across the third resistor R3 by the current operational amplifier 21, which is R3×Io, where Io is the load current. The voltage difference Vs is output to the second voltage conversion unit 22 and multiplied by the preset conversion factor by the second voltage conversion unit 22 to obtain the second voltage Vs', which is R3×Io×(R2×R)/((R1+R2)×R3) =(Io×R2×R)/(R1+R2). The second voltage Vs' is then output to the reference voltage adjustment module 30, where the second voltage Vs' and the original reference voltage Vref are summed to obtain the adjusted reference voltage Vref', which is Vref+Vs'=Vref+(Io×R2×R)/(R1+R2). The adjusted reference voltage Vref' is then fed to the second input terminal of the control module 40, which is also the non-inverting input terminal of the differential amplifier 41. At this point, as the output voltage is not compensated yet, the voltage at the inverting input terminal of the differential amplifier 41 is still the one without load, i.e., (Vo×R2)/(R1+R2). With the non-inverting input terminal has the voltage Vref+(Io×R2×R)/(R1+R2), the voltage difference between the non-inverting and inverting input terminals is Vref+(Io×R2×R)/(R1+R2)−(Vo×R2)/(R1+R2), which is greater than Vref−(Vo×R2)/(R1+R2). The differential amplifier 41 outputs the corresponding control voltage Vc to the PWM controller 42 to increase the duty ratio of the its output pulse signal to the driving unit 43. The first FET Q1 therefore has a longer conduction interval within a cycle of the pulse signal, the output voltage Vout is increased, the voltage at the first output terminal of the first voltage conversion unit 10, also the second terminal of the first resistor R1, is increased, until the voltage difference between the non-inverting and inverting input terminals of the differential amplifier 41 is again equal to Vref−(Vo×R2)/(R1+R2). The differential amplifier 41 again outputs the corresponding control voltage Vc to the PWM controller 42 to keep the duty ratio of its pulse signal unchanged. In the meantime, the first voltage, also the voltage at the second terminal of the first resistor R1, also the voltage at the inverting input terminal of the differential amplifier 41 becomes Vref+(Io×R2×R)/(R1+R2)−(Vref−(Vo×R2)/(R1+R2))=R2(Io×R+Vo)/(R1+R2). The output voltage Vout becomes R2(Io×R+Vo)/(R1+R2)×(1+R1/R2)=Io×R+Vo which, compared to the output voltage standard value Vo, has a difference Io×R. The difference is the product of the load current and the sum of the output impedance of the DC boost circuit and the line impedance between the DC boost circuit and the load 2, which is exactly the voltage drop of the output voltage Vout. Therefore the output voltage is compensated for its voltage drop resulted from the output impedance and line impedance, thereby ensuring a stable level to the output voltage. Applying the DC boost circuit to an OLED display device to provide positive power voltage to the pixel driving circuit, the positive output voltage is stable regardless of the load, thereby enhancing the display quality of the OLED display device.

Figure 3:
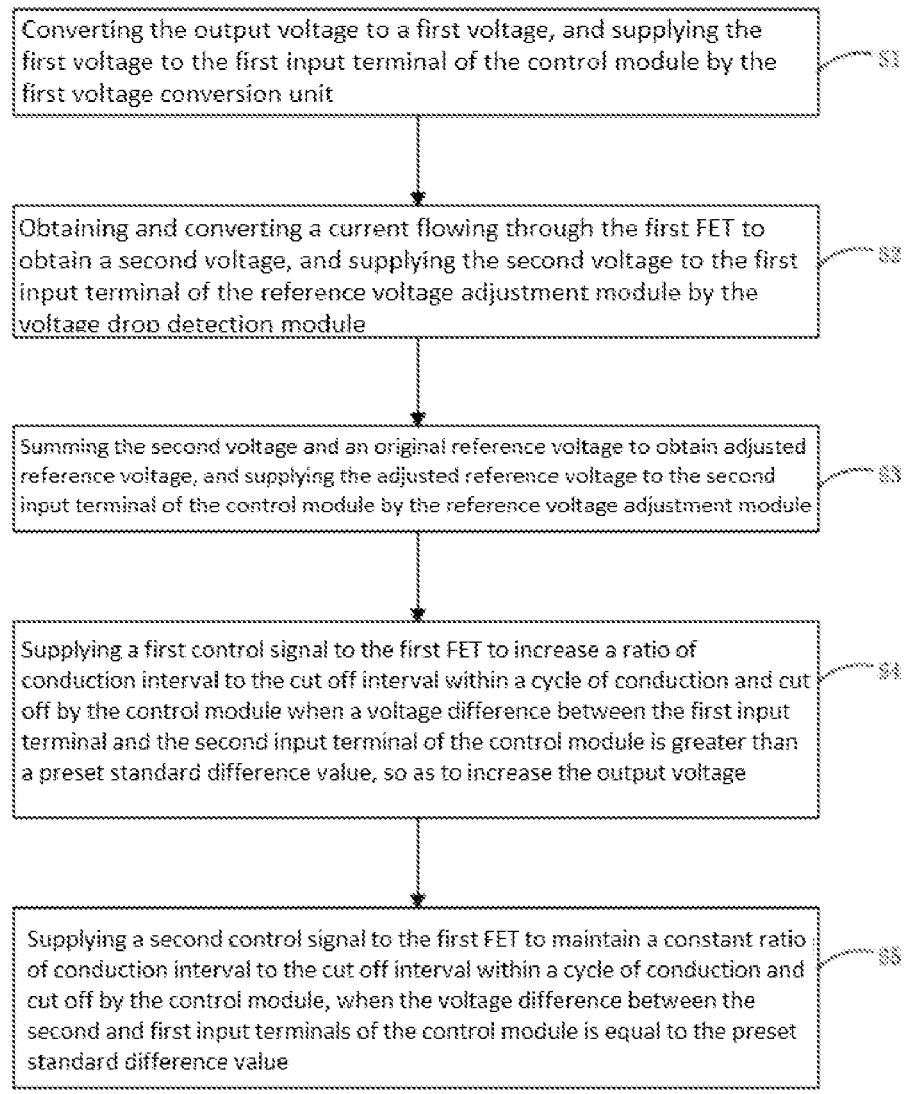
FIG. 3 is a flow diagram of a DC boost method according to an embodiment of the present invention.

As shown in FIG. 3, together with FIG. 2, the present invention also teaches a DC boost method for the above DC boost circuit, based on a same inventive concept. The method includes the following steps.

Step S1: converting an output voltage Vout to obtain a corresponding first voltage, and supplying the first voltage to the first input terminal of the control module 40 by the first voltage conversion unit 10.

Specifically, in step S1, the voltage at the second terminal of the first resistor R1 is the first voltage, and the first input terminal of the control module 40 is also the inverting input terminal of the differential amplifier 41.

Step S2: obtaining and converting a current flowing through the first FET Q1 to obtain a corresponding second voltage Vs', and supplying the second voltage Vs' to the first input terminal of the reference voltage adjustment module 30 by the voltage drop detection module 20.

Specifically, in step S2, the voltage drop detection module 20 obtains the current flowing through the first FET Q1, also the load current, by using the third resistor R3, and uses the current operational amplifier 21 to obtain the voltage difference Vs across the third resistor R3. The voltage difference Vs is R3×Io, where Io is the load current. The voltage difference Vs is then output to the second voltage conversion unit 22, where the voltage difference Vs is multiplied by a preset conversion factor to obtain the second voltage Vs', which is R3×Io×(R2×R)/((R1+R2)×R3)=Io×R2×R/(R1+R2). The second voltage Vs' is then output to the reference voltage adjustment module 30.

Step S3: summing the second voltage Vs' and an original reference voltage Vref to obtain an adjusted reference voltage Vref', and supplying the adjusted reference voltage Vref' to the second input terminal of the control module 40 by the reference voltage adjustment module 30.

Step S4: supplying a control signal to the first FET Q1 to increase the ratio of conduction interval to the cutoff interval within a cycle of conduction and cutoff by the control module 40 when a voltage difference between the first input terminal and the second input terminal of the control module 40 is greater than a preset standard difference value, so as to increase the output voltage Vout.

Specifically, when the DC boost circuit is connected to the load 2, there is impedance along the connection line. The DC boot circuit has output impedance itself. The output voltage Vout from the cathode of the diode D1 would suffer voltage drop when the output voltage reaches the load 2. There will be a corresponding load current through the load 2. Another current of identical magnitude flows through the first FET Q1 so that the second voltage Vs'=(Io×R2×R)/(R1+R2) is greater than 0. The reference voltage adjustment module 30 therefore sums the original reference voltage Vref and the second voltage Vs' and obtains the adjusted reference voltage Vref'=Vref+(Io×R2×R)/(R1+R2). The adjusted reference voltage Vref', compared the voltage (Vo×R2)/(R1+R2) at the second terminal of the first resistor R1 without load 2, has a difference greater than the preset standard difference value Vref−(Vo×R2)/(R1+R2). That is, the voltage difference between the second and first input terminals of the control module 40, also the voltage difference between the non-inverting and inverting input terminals of the differential amplifier 41, is greater than the preset standard difference value Vref−(Vo×R2)/(R1+R2). At this point, the differential amplifier 41 outputs the corresponding control voltage Vc to the PWM controller 42, which increases the duty ratio of its output pulse signal to the driving unit 43. The driving unit 43 controls the first FET Q1 to have a longer conduction interval within a cycle of the pulse signal. The output voltage Vout is as such increased. The first voltage conversion unit 10 then also has an increased voltage at the output terminal, also the second terminal of the first resistor R1.

Step S5: supplying a control signal to the first FET Q1 to maintain a constant ratio of conduction interval to the cutoff interval within a cycle of conduction and cutoff by the control module 40, when the voltage difference between the second and first input terminals of the control module 40 is equal to the preset standard difference value.

Specifically, after step S4 is completed, the output voltage Vout is increased. The first voltage conversion unit 10 then has an increased voltage at the output terminal, also the second terminal of the first resistor R1, until the voltage difference between the non-inverting and inverting input terminals of the differential amplifier 41 is again equal to Vref−(Vo×R2)/(R1+R2). Then, step S5 is executed. The differential amplifier 41 outputs the corresponding control voltage Vc to the PWM controller 42 so that the pulse signal from the PWM controller 42 has a constant duty ratio. At this point, the first voltage, also the voltage at the second terminal of the first resistor R1, and also the voltage at the inverting input terminal of the differential amplifier 41, becomes Vref+(Io×R2×R)/(R1+R2)−(Vref−(Vo×R2)/(R1+R2))=R2(Io×R+Vo)/(R1+R2). The output voltage Vout becomes R2(Io×R+Vo)/(R1+R2)×(1+R1/R2)=Io×R+Vo. That is, the difference between the output voltage Vout and the output voltage standard value Vo is Io×R, which is the product of the load current and the sum of the DC boost circuit output impedance and the line impedance to the load 2, also the voltage drop suffered by the output voltage Vout. The voltage drop to the DC boost circuit's output voltage is compensated. The voltage level of the output voltage is stabilized. When the output voltage is applied to OLED display device to provide the positive power voltage for the pixel driving circuit, regardless of the load variation from different displayed frames, the positive power voltage supplied by the DC boost circuit remains stable, thereby enhancing display quality of the OLED display device.

As described above, the present invention teaches a DC boost circuit including an inductor, a diode, a first capacitor, a first FET, a first voltage conversion unit, a voltage drop detection module, a reference voltage adjustment module, and a control module. After a load is connected, the voltage drop detection module obtains a current flowing through the diode and outputs a corresponding second voltage to the reference voltage adjustment module, causing an output voltage from the reference voltage adjustment module greater than an original reference voltage. The control module controls the first FET to increase a ratio of its conduction interval to its cutoff interval in a cycle of conduction and cutoff, thereby increasing the output voltage to compensate the voltage drop resulted from the impedance between the DC boost circuit and the load. The output voltage is therefore ensured to have a stable level. The DC boost circuit of the present invention therefore effectively compensates the output voltage drop caused by the impedance between the DC boost circuit and the load, and guarantees a stable output voltage.

Above are embodiments of the present invention, which does not limit the scope of the present invention. Any equivalent amendments within the spirit and principles of the embodiment described above should be covered by the protected scope of the invention.

What is claimed is:

1. A direct current (DC) boost circuit, comprising an inductor, a diode, a first capacitor, a first field effect transistor (FET), a first voltage conversion unit, a voltage drop detection module, a reference voltage adjustment module, and a control module, wherein the inductor has a first terminal electrically connected to an input voltage and a second terminal electrically connected to an anode of the diode; a cathode of the diode is electrically connected and provides an output voltage to a load; the first capacitor has a first terminal electrically connected to the cathode of the diode and a second terminal to ground; the first FET has a drain electrically connected the inductor's second terminal, a gate electrically connected to an output terminal of the control module, and a source electrically connected to an input terminal of the voltage drop detection module; the first voltage conversion unit has an input terminal electrically connected to the cathode of the diode, and an output terminal electrically connected to a first input terminal of the control module; the voltage drop detection module has an output terminal electrically connected to a first input terminal of the reference voltage adjustment module; the reference voltage adjustment module has a second input terminal electrically connected to an original reference voltage, and an output terminal electrically connected to a second input terminal of the control module;

the first voltage conversion unit converts the output voltage to obtain a corresponding first voltage, and supplies the first voltage to the first input terminal of the control module;

the voltage drop detection module obtains and converts a current flowing through the first FET to obtain a corresponding second voltage, and supplies the second voltage to the first input terminal of the reference voltage adjustment module;

the reference voltage adjustment module sums the second voltage and an original reference voltage to obtain an adjusted reference voltage, and supplies the adjusted reference voltage to the second input terminal of the control module;

the control module supplies a first control signal to the first FET to increase a ratio of conduction interval to cutoff interval within a cycle of conduction and cutoff when a voltage difference between the first input terminal and the second input terminal of the control module is greater than a preset standard difference value, so as to increase the output voltage until the voltage difference between the first input terminal and the second input terminal of the control module is equal to the preset standard difference value; and the control module then supplies a second control signal to the first FET to keep the ratio of conduction interval to cutoff interval constant;

the first voltage conversion unit comprises a first resistor (R1) and a second resistor (R2); the first resistor has a first terminal electrically connected to the cathode of the diode; a second terminal electrically connected to the first terminal of the second resistor; the second terminal of the second resistor is connected to ground; the first and second terminals of the first resistor are the input and output terminals of the first voltage conversion unit, respectively;

the voltage drop detection module comprises a third resistor, a current operational amplifier, and a second voltage conversion unit; the second voltage conversion unit is structured as the first voltage conversion unit; the third resistor has a first terminal electrically connected to the source of the first FET, and a second terminal to ground; the non-inverting input terminal and inverting input terminal of the operational amplifier are electrically connected to the first and second terminals of the third resistor, respectively; the output terminal of the operational amplifier is electrically connected an input terminal of the second voltage conversion unit; an output terminal of the second voltage conversion unit is electrically connected to the first input terminal of the reference voltage adjustment module; the input and output terminals of the voltage drop detection module are the first terminal of the third resistor and the output terminal of the second voltage conversion unit;

the control module comprises an differential amplifier, a pulse width modulation (PWM) controller, and a driving unit; the differential amplifier has the non-inverting input terminal electrically connected to the output terminal of the reference voltage adjustment module, the inverting input terminal electrically connected to the output terminal of the first voltage conversion unit, and an output terminal electrically connected an input terminal of the PWM controller; an output terminal of the PWM controller is electrically connected an input terminal of the driving unit; an output terminal of the driving unit is electrically connected to the gate of the first FET; the first and second input terminals of the control module are respectively the differential amplifier's inverting and non-inverting input terminals; the output terminal of the control module is the output terminal of the driving unit;

the current operational amplifier obtains a voltage difference across the third resistor and outputs the voltage difference to the second voltage conversion unit;

the second voltage conversion unit multiplies the voltage difference across the third resistor by a preset conversion factor to produce a second voltage, and outputs the second voltage to the first input terminal of the reference voltage adjustment module;

the reference voltage adjustment module is a voltage adder;

the differential amplifier produces and output a control voltage to the PWM controller according to a voltage difference between the non-inverting and inverting input terminals of the differential amplifier;

the PWM controller outputs a pulse signal to the driving unit controlled by the control voltage;

the driving unit conducts the first FET when the pulse signal is at a high level and cuts off the first FET when the pulse signal is at a low level;

when the voltage difference between the non-inverting and inverting input terminals of the differential amplifier is greater than the preset standard difference value, the differential amplifier outputs the corresponding control voltage to control the PWM controller to alter the duty ratio of its output pulse signal so that the first FET has a longer conduction interval within a cycle of the of the pulse signal; the output voltage is therefore increased until the voltage difference between the differential amplifier's inverting and non-inverting input terminals equal to the preset standard difference value; and the differential amplifier then outputs the corresponding control voltage to keep the pulse signal of the PWM controller at a fixed duty ratio;

the conversion factor is (R2×R)/((R1+R2)×R3); R3 is the resistance of the third resistor; and R is the output impedance of the DC boost circuit plus the line impedance between the DC boost circuit and the load.

2. The DC boost circuit according to claim 1, wherein the preset standard difference value is Vref-(Vo×R2)/(R1+R2); Vo is a preset output voltage standard value; R1 is the resistance of the second resistor; R2 is the resistance of the second resistor; and Vref is the original reference voltage.

3. The DC boost circuit according to claim 1, wherein the diode is a Schottky diode.

4. The DC boost circuit according to claim 1, further comprising a second capacitor and a third capacitor, wherein the second capacitor has a first terminal electrically connected to the first terminal of the inductor, and a second terminal to ground; and the third capacitor has a first terminal electrically connected to the cathode of the diode, and a second terminal to the output terminal of the first voltage conversion unit.

5. The DC boost circuit according to claim 1, further comprising a bandgap reference voltage unit electrically connected to the second input terminal of the reference voltage adjustment module, wherein the original reference voltage is provided by the bandgap reference voltage unit.

6. The DC boost circuit according to claim 1, wherein the output voltage is the positive power voltage to an OLED display device; and the load is the pixel driving circuit of the OLED display device.

* * * * *